(12) United States Patent
Gingrich, III et al.

(10) Patent No.: US 12,322,887 B2
(45) Date of Patent: Jun. 3, 2025

(54) CIRCUIT BOARD WAFER WITH CONTACTS MOUNTED ON CASTELLATED EDGES

(71) Applicant: TE Connectivity Solutions GmbH, Schaffhausen (CH)

(72) Inventors: Charles Raymond Gingrich, III, Mechanicsburg, PA (US); Keith Edwin Miller, Manheim, PA (US); Scott Eric Walton, Mount Joy, PA (US); Tim Robert Chevalier, Cleona, PA (US)

(73) Assignee: TE Connectivity Solutions GmbH (CH)

( * ) Notice: Subject to any disclaimer, the term of this patent is extended or adjusted under 35 U.S.C. 154(b) by 413 days.

(21) Appl. No.: 18/050,542

(22) Filed: Oct. 28, 2022

(65) Prior Publication Data
US 2024/0145960 A1 May 2, 2024

(51) Int. Cl.
*H01R 12/73* (2011.01)
*H01R 12/58* (2011.01)
*H01R 12/72* (2011.01)

(52) U.S. Cl.
CPC ........ *H01R 12/73* (2013.01); *H01R 12/585* (2013.01); *H01R 12/724* (2013.01)

(58) Field of Classification Search
CPC ...... H01R 12/58; H01R 12/585; H01R 12/71; H01R 12/72; H01R 12/722; H01R 12/724; H01R 12/73; H01R 12/735; H01R 12/737

USPC .................................................... 439/607.09
See application file for complete search history.

(56) References Cited

U.S. PATENT DOCUMENTS

| | | | |
|---|---|---|---|
| 10,003,144 | B1 | 6/2018 | Sharf |
| 10,993,314 | B2 | 4/2021 | Charbonneau et al. |
| 10,998,678 | B1 | 5/2021 | Miller et al. |
| 11,025,014 | B1 | 6/2021 | Miller et al. |
| 2024/0145960 | A1* | 5/2024 | Gingrich, III ......... H01R 12/58 |

* cited by examiner

*Primary Examiner* — Khiem M Nguyen

(57) ABSTRACT

A substrate assembly includes a first substrate having a first surface and an oppositely facing second surface. Signal pathways are provided on the first surface. The signal pathways extend to first openings which extend inward from an edge of the substrate. First ground pathways are provided on the first surface. Each of the first ground pathways are positioned adjacent at least one of the signal pathways. The first ground pathways extend to second openings which extend inward from the edge of the substrate. Signal contacts are mounted to the first substrate. The signal contacts have first mounting surfaces which provide mechanical and electrical engagement with the first openings. Ground contacts are mounted to the first substrate. The ground contacts have second mounting surfaces which provide mechanical and electrical engagement with the second openings.

20 Claims, 5 Drawing Sheets

1

CIRCUIT BOARD WAFER WITH CONTACTS MOUNTED ON CASTELLATED EDGES

FIELD OF THE INVENTION

The present invention relates to a printed circuit board which has contacts which allow the printed circuit board to be mounted to a backplane or daughter card in a manner to provide secure mechanical and electrical connection while providing proper shielding of the signal pathways on the circuit board. In particular the invention relates to a circuit board with contacts mounted on castellated edges.

BACKGROUND OF THE INVENTION

Due to the increasing complexity of electronic components, it is desirable to fit more components in less space on a circuit board or other substrate. Consequently, the spacing between electrical terminals within connectors and daughter cards has been reduced, while the number of electrical terminals or pathways provided in the connectors or daughter cards has increased, thereby increasing the need in the electrical arts for electrical components that are capable of handling higher and higher speeds and to do so with greater and greater signal densities. It is desirable for such components to have not only reasonably constant impedance levels, but also acceptable levels of impedance and crosstalk, as well as other acceptable electrical and mechanical characteristics. Therefore, there remains a need to provide appropriate shielding to preserve signal integrity and to minimize crosstalk as speeds of signals increase and the footprint of the components remains the same or decreases.

It would, therefore, be beneficial to provide a circuit board which reduces crosstalk between signal contact pairs and which facilitates the insertion of the circuit board into a backplane, daughter card or the like. It would also be beneficial to provide a circuit board wafer which increases or maximizes the grounding plane, thereby minimizing the crosstalk between signal contact pairs.

SUMMARY OF THE INVENTION

An embodiment is directed to a substrate assembly for mounting to a second substrate. The substrate assembly includes a first substrate having a first surface and an oppositely facing second surface. Signal pathways are provided on the first surface. The signal pathways extend to first openings which extend inward from an edge of the substrate. The first openings have first walls. First ground pathways are provided on the first surface. Each of the first ground pathways are positioned adjacent at least one of the signal pathways. The first ground pathways extend to second openings which extend inward from the edge of the substrate. The second openings have second walls. Signal contacts are mounted to the first substrate. The signal contacts have first mounting surfaces which are provide in mechanical and electrical engagement with the first walls of the first openings. Ground contacts are mounted to the first substrate. The ground contacts have second mounting surfaces which are provide in mechanical and electrical engagement with the second walls of the second openings. A mating force applied to the signal contacts and the ground contacts will be transferred to the substrate.

An embodiment is directed to a printed circuit board assembly for mounting to a second printed circuit board. The printed circuit board assembly includes a first printed circuit board having a first surface and an oppositely facing second surface. Signal pathways are provided on the first surface. The signal pathways extend to first openings which extend inward from a castellated edge of the first printed circuit board. The first openings have first walls. First ground pathways are provided on the first surface. Each of the first ground pathways are positioned adjacent at least one of the signal pathways. The first ground pathways extend to second openings which extend inward from the castellated edge of the first printed circuit board. The second openings have second walls. One or more second ground pathways are provided on the second surface. The one or more second ground pathways extend to the castellated edge of the first printed circuit board. Signal contacts are mounted to the first openings and ground contacts are mounted to the second openings. Wherein as the ends of the signal pathways, the first ground pathways and the second ground pathways are positioned in line or about the castellated edge of the printed circuit boards the area of ground that is present on the printed circuit boards is maximized, which minimizes crosstalk between signal pairs of the signal pathways.

Other features and advantages of the present invention will be apparent from the following more detailed description of the illustrative embodiment, taken in conjunction with the accompanying drawings which illustrate, by way of example, the principles of the invention.

DETAILED DESCRIPTION OF THE INVENTION

Figure 1:
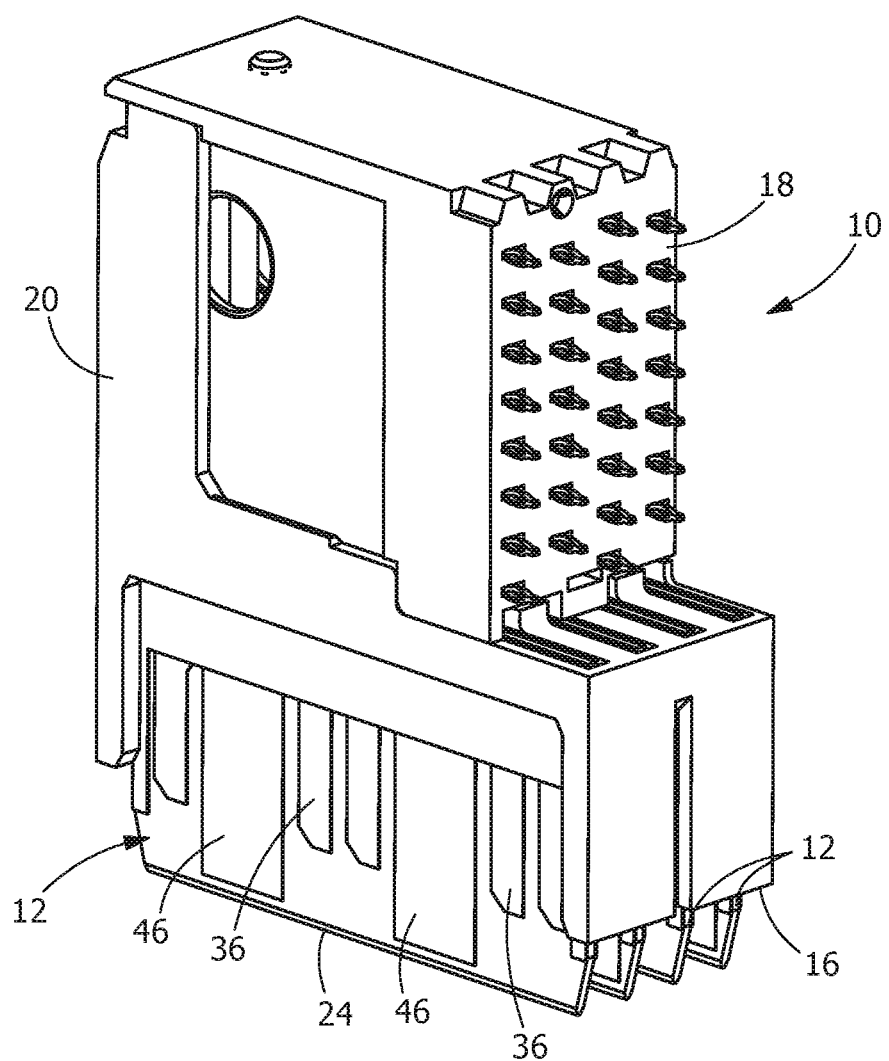
FIG. 1 is a perspective view of an illustrative connector, the connector having a plurality of illustrative printed circuit board wafers or daughter cards with contacts mounted to castellated edges according to the present invention.

The description of illustrative embodiments according to principles of the present invention is intended to be read in connection with the accompanying drawings, which are to be considered part of the entire written description. In the description of embodiments of the invention disclosed herein, any reference to direction or orientation is merely intended for convenience of description and is not intended in any way to limit the scope of the present invention. Relative terms such as "lower," "upper," "horizontal," "vertical," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation unless explicitly indicated as such. Terms such as "attached," "affixed," "connected," "coupled," "interconnected," and similar refer to a relationship wherein structures are secured or attached to one another either directly or indirectly through intervening structures, as well as both movable or rigid attachments or relationships, unless expressly described otherwise.

Moreover, the features and benefits of the invention are illustrated by reference to the preferred embodiments. Accordingly, the invention expressly should not be limited to such embodiments illustrating some possible non-limiting combination of features that may exist alone or in other combinations of features, the scope of the invention being defined by the claims appended hereto.

Figure 5:
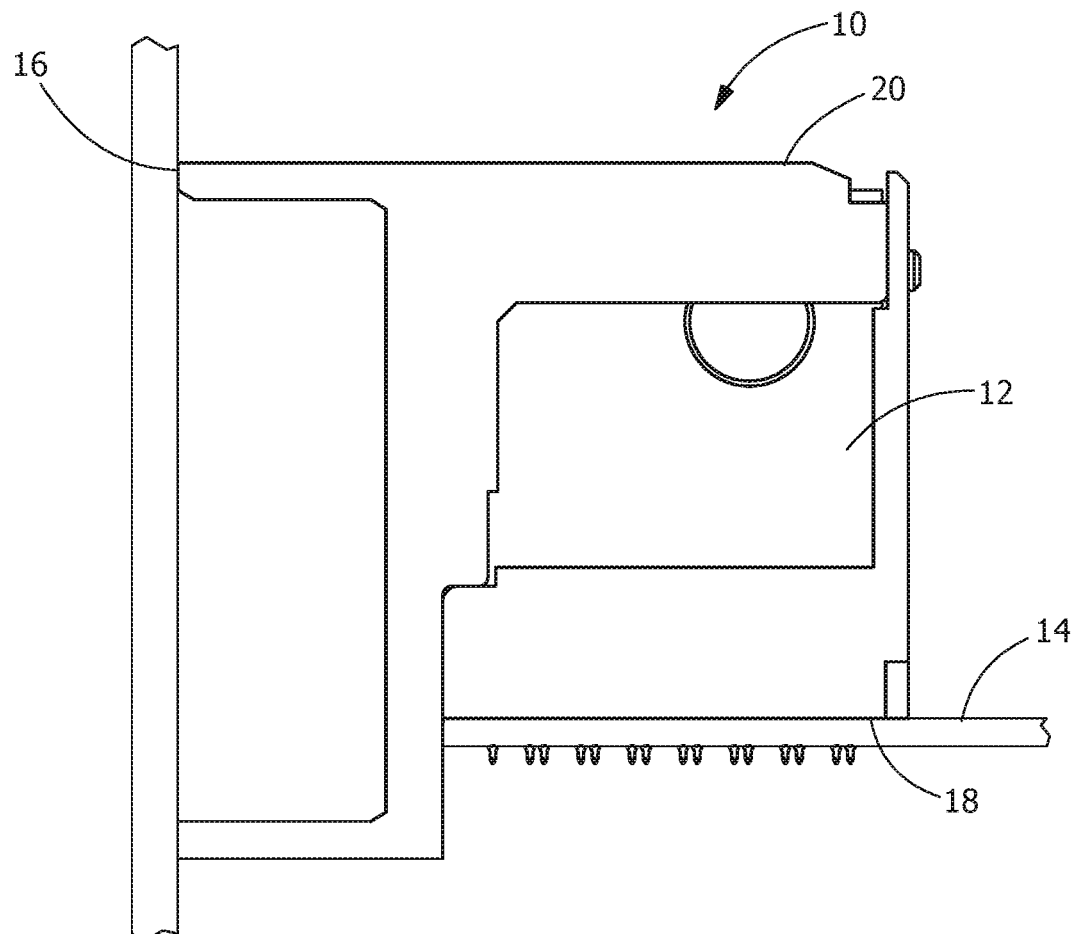
FIG. 5 is a perspective view of the printed circuit board wafer of FIG. 2 mounted to a daughter card.

FIG. 1 shows an illustrative electrical connector 10 having one or more printed circuit boards or substrates 12 which are electrically and mechanically connected to another substrate or daughter card 14 (FIG. 5). The electrical connector 10 shown and described herein is meant to be illustrative, as the invention can be used in other connectors or with other boards.

In the illustrative embodiment shown, the connector 10 constitutes a right angle connector wherein a mating end 16 and mounting end 18 of the connector 10 are oriented perpendicular to one another. The connector 10 is mounted to the daughter card 14 (FIG. 5) at the mounting end 18. The connector 10 is mounted to the mating connector (not shown) at the mating end 16. Other orientations of the ends 16, 18 are possible in alternative embodiments. The connector 10 includes a housing 20 which supports the plurality of circuit boards or substrates 12.

Each of the substrates 12 has a mating end 24 configured to mate with the mating connector (not shown) and a mounting end 26 which is configured to mount to the daughter card 14. The substrates 12 have a plurality of individual signal traces or pathways 28 and a plurality of first ground traces or pathways 30 provide on a first surface 34 of each substrate 12.

Figure 4:
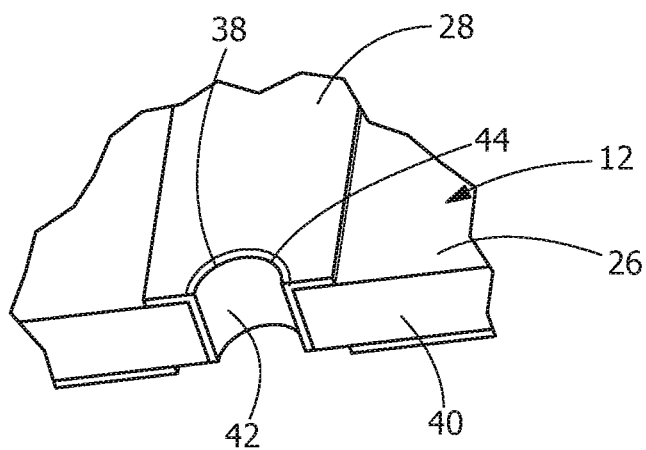
FIG. 4 is an enlarged view of one of the openings provided on the castellated edge of the printed circuit board wafer prior to the contact being mounted thereto.

The signal pathways 28 include mating signal contact pads 36 proximate the mating end 24 of the substrate 12. The signal pathways 28 extend to openings or recesses 38 which extend inward from an edge 40 at the mounting end 26 of the substrate 12. As shown in FIG. 4, the openings or recesses 38 have conductive plating 42 provided on walls 44 of the openings 38, such as, but not limited to copper plating which extends about inner walls of the openings 38. The plating 42 of each opening 38 is provided in electrical engagement with a respective signal pathway 28.

The first ground pathways 30 include mating ground contact pads 46 provide proximate the mating end 24 of the substrate 12. The first ground pathways 30 extend to openings or recesses 48 which extend inward from the edge 40 at the mounting end 26 of the substrate 12. As shown in FIG. 4, the openings or recesses 40 have conductive plating 42 provided on walls 44 of the openings 48, such as, but not limited to copper plating which extends about inner walls of the openings 48. The plating 42 of each opening 40 is provided in electrical engagement with a respective first ground pathway 30.

Figure 8:
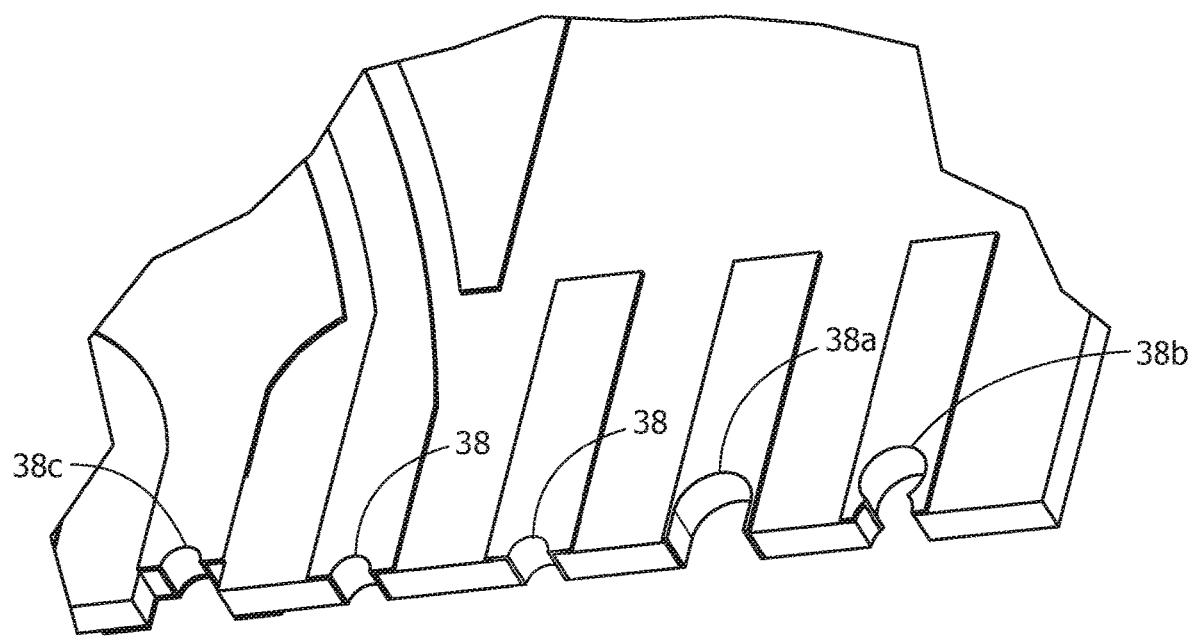
FIG. 8 is a front perspective view of an alternate printed circuit board wafer with alternate openings on the castellated edges of the printed circuit board.

As the openings 38, 48 extend inward from the edge 40 of the substrate 12, the edge 40 is a castellated edge. While an illustrative configuration of the openings 38, 48 is shown in FIGS. 2 through 5, other configurations of the openings 38, 48 may be used. Illustrative embodiments of other opening configurations are shown in FIG. 8.

Figure 3:
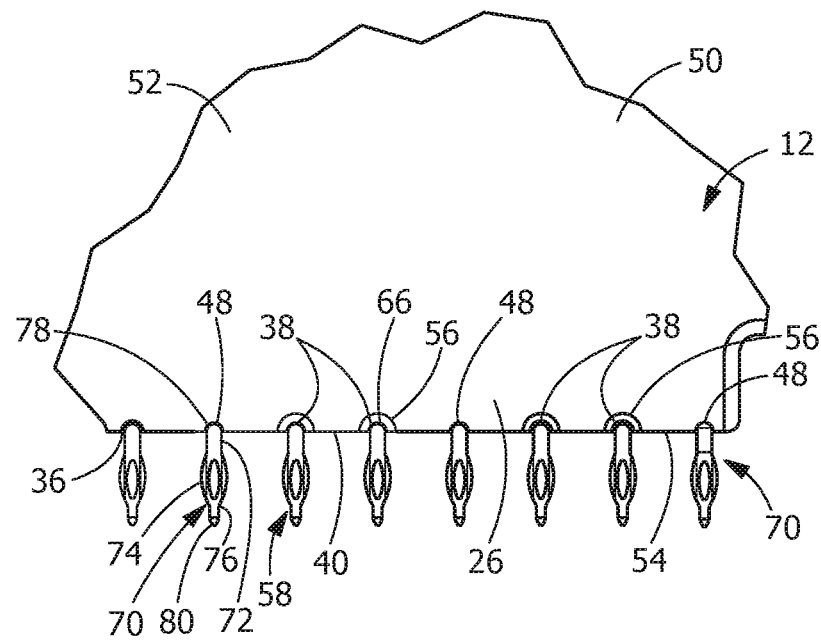
FIG. 3 is a back perspective view of the printed circuit board wafer of FIG. 2.

As shown in FIG. 3, each of the substrates 12 has second ground traces or pathways 50 on a second surface 52 of the substrate 12. The second surface 52 of each substrate 12 is opposed and spaced from the first surface 34 of that substrate 12. The second ground traces or pathways 50 extend from proximate the mating end 24 to the mounting end 26. Ends 54 of the second ground pathways 50 are positioned in line or abut the mounting end 26 of the substrate 12. The plating 42 of each opening 40 is provided in electrical engagement with the second ground pathway 50. Voids 56 are provided in the second ground pathways 50. The voids 56 are provided in line with the openings 38 for the signal pathways 28 to isolate the signal pathways 28 from the second ground pathways 50.

The combination of the first ground pathways 30 and the second ground pathways 50 surround pairs of signal pathways 28. As the first ground pathways 30 and the second ground pathways 50 are electrically commoned together, the first ground pathways 30 and the second ground pathways 50 provide electrical shielding and reduce crosstalk between the pairs of signal pathways 28.

In the illustrative embodiment shown in FIG. 1, the connector 10 has four substrates 12 which are positioned adjacent to each other. However, other numbers of substrates may be used. Each substrate 12 is spaced from adjacent substrates 12. With the connector 10 properly assembled, first ground pathways 30 and the second ground pathways 50 of adjacent substrate 12 extend about the periphery of the pairs of signal pathways 28 and surround the pairs of signal pathways 28 to provide electrical shielding for the pairs of signal pathways 28. In an exemplary embodiment, entire, 360 degree shielding is provided by the first ground pathways 30 and the second ground pathways 50 along the length of the signal pathways 28. The first ground pathways 30 and the second ground pathways 50 help to control the electrical characteristics throughout the substrates 12, including at the mating ends 24 and the mounting ends, such as by controlling cross talk, signal radiation or other electrical characteristics.

The substrates 12 have mounting signal contacts 58 which are mechanically and electrically mounted in the openings 38. In the embodiment shown in FIGS. 2 through 4, each illustrative signal contact 58 has a substrate mounting portion 60, a compliant portion 62 and a lead-in portion 64. The substrate mounting portion 60 has a mounting surface 66. The lead-in portion 64 has tapered surfaces 68. In the embodiment shown, the compliant portion 62 has an eye of the needle configuration, however other configurations may be used.

The substrate mounting portions 60 of the signal contacts 58 are positioned in the openings 38 at the end of the first signal pathways 28. The substrate mounting portions 60 are secured to the openings 38 by soldering or other known mounting techniques which provide for both mechanical and electrical interconnection. In this position, the mounting surfaces 66 of the substrate mounting portions 60 engage the conductive plating 42 of the openings 48. The arcuate shape of the openings 48 and the arcuate shape of the mounting surfaces 66 provide a stable surface through which the electronic signals can pass between the openings 38 and the mounting surfaces 66. As the mounting surfaces 66 are soldered or otherwise mounted in the openings 38, a reliable signal connection is established even if the connector 10 is exposed to shock and high vibration conditions.

The substrates 12 have mounting ground contacts 70 which are mechanically and electrically mounted in the openings 48. In the embodiment shown in FIGS. 2 through 4, each illustrative ground contact 58 has a substrate mounting portion 72, a compliant portion 74 and a lead-in portion 76. The substrate mounting portion 72 has a mounting surface 78. The lead-in portion 76 has tapered surfaces 80. In the embodiment shown, the compliant portion 74 has an eye of the needle configuration, however other configurations may be used. In the embodiment shown in FIGS. 2 through 5, the signal contacts 58 are similar to the ground contacts 70, however, the signal contacts 58 and the ground contacts 70 may have different configurations.

The substrate mounting portions 72 of the ground contacts 70 are positioned in the openings 48 at the end of the first ground pathways 30. The substrate mounting portions 72 are secured to the openings 48 by soldering or other known mounting techniques which provide for both mechanical and electrical interconnection. In this position, the mounting surfaces 78 of the substrate mounting portions 72 engage the conductive plating 42 of the openings 48. The arcuate shape of the openings 48 and the arcuate shape of the mounting surfaces 78 provide a stable surface through which the electronic signals can pass between the openings 48 and the mounting surfaces 78. As the mounting surfaces 78 are soldered or otherwise mounted in the openings 48, a reliable ground connection is established even if the connector 10 is exposed to shock and high vibration conditions.

As the connector 10 and substrate 12 are moved into engagement with the daughter card 14, the tapered surfaces 68 of the lead-in portions 64 of the signal contacts 58 and the tapered surfaces 80 of the lead-in portions 76 of the ground contacts 70 are moved into through holes (not shown) of the daughter card 14. As insertion continues, the compliant portions 62 of the signal contacts 58 and the compliant portions 74 of the ground contacts 70 are moved into the through holes. As the compliant portions 62, 74 have a larger diameter than the diameter of the through holes, a significant force is required to push or force the compliant portions 62, 74 into the through holes (not shown).

By positioning the signal contacts 58 and the ground contacts 70 in the same plane as the substrate 12, the substrate 12 can be used to support the insertion of the signal contacts 58 and the ground contacts 70 into the through holes. As the signal contacts 58 and the ground contacts 70 are inserted, the engagement of the mounting surfaces 66 of the signal contacts 58 and the mounting surfaces 78 of the ground contacts 70 with the openings 38, 48 allows the insertion forces to be distributed through the mounting surfaces 66 and the mounting surfaces 78 and the openings 38, 48 to the substrate 12. This allows the forces/stresses associated with mating the substrates 12 to the daughter card 14 to be transferred to substrate 12.

This also allows a sufficient force to be applied to the signal contacts 58 and the ground contacts 70 to facilitate mating of the compliant portions 62, 74 to the daughter card 14. As the mating forces are transferred to the substrate 12, the contacts 58, 70 are not damaged or deformed during mating, thereby providing a secure and reliable connection between the substrate 12 and the daughter card 14.

Figure 2:
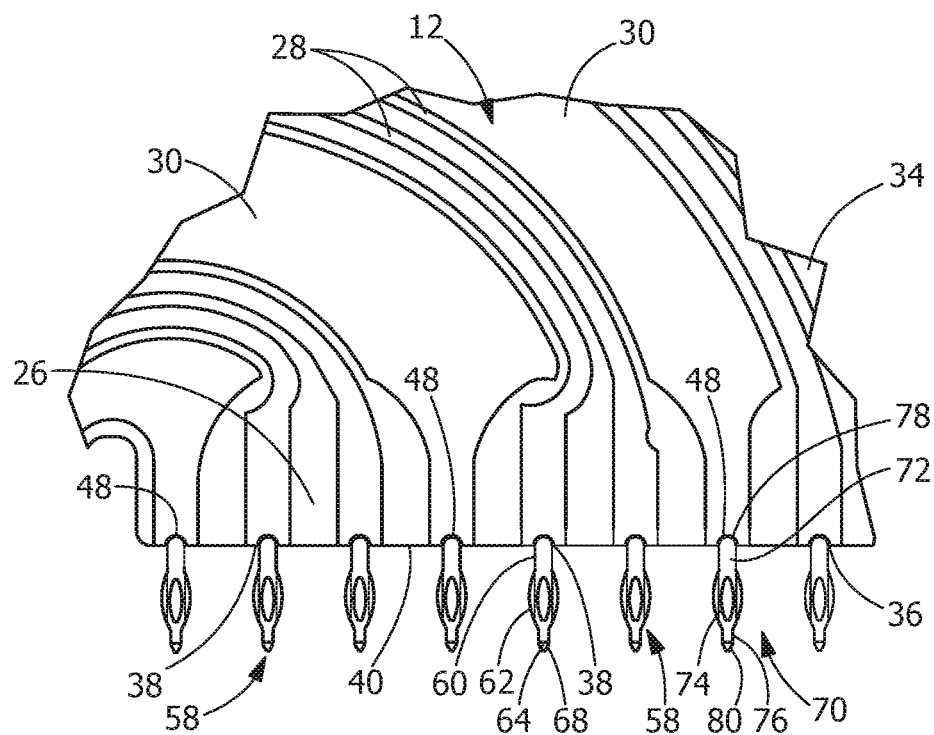
FIG. 2 is a front perspective view of one of the printed circuit board wafers of FIG. 1.

As shown in FIGS. 2 through 4, the substrate mounting portions 60 of the signal contacts 58 are positioned in the openings 38 at the end of the signal pathways 28. The substrate mounting portions 60 are secured to the openings 38 by soldering or other known mounting techniques which provide for both mechanical and electrical interconnection. In this position, the mounting surfaces 66 of the substrate mounting portions 60 engage the conductive plating 42 of the openings 38. The arcuate shape of the openings 38 and the arcuate shape of the mounting surfaces 66 provide a stable surface through which the electronic signals can pass between the openings 38 and the mounting surfaces 66. As the mounting surfaces 66 are soldered or otherwise mounted in the openings 38, the signal is reliably transmitted even if the connector 10 is exposed to shock and high vibration conditions.

As the ends of the signal pathways 28, the first ground pathways 30 and the second ground pathways 50 are positioned in line or abut the mounting ends 26 of the substrates 12 the area of ground that is present on the substrates 12 is maximized, which in turn minimizes crosstalk between signal pairs. In addition, as the openings 38 and openings 48 are positioned proximate to the mounting ends 26, the length of the mounting portions 60 of the signal contacts 58 and the length of the mounting portions 72 of the ground contacts 70 is minimized, which also reduces the crosstalk between signal pairs.

The configuration of the signal contacts 58 and the ground contacts 70 and the configuration of the openings 38, 48 allow the compliant portions 62, 74 of the contacts 58, 70 to be positioned proximate to the edges 40 of the mounting ends 26 of the substrates 12. This allows the edges 40 of the substrates 12 to be positioned proximate to a surface of the daughter card 14, as shown in FIG. 5. In so doing, the ground pathways 30, 50 extend proximate to the daughter card 14, thereby reducing or eliminating space between the substrates 12 and the daughter card 14 where crosstalk between the signal pairs can occur.

Different configurations of the openings 38, 48 may be used. FIG. 8 shows various illustrative alternate embodiments of the openings. Configurations of the openings include, but are not limited to, half round hole 38, 48, slotted hole 38*a*, 48*a*, double drilled hole 38*b*, 48*b* and notched hole 38*c*, 48*c*.

Figure 6:
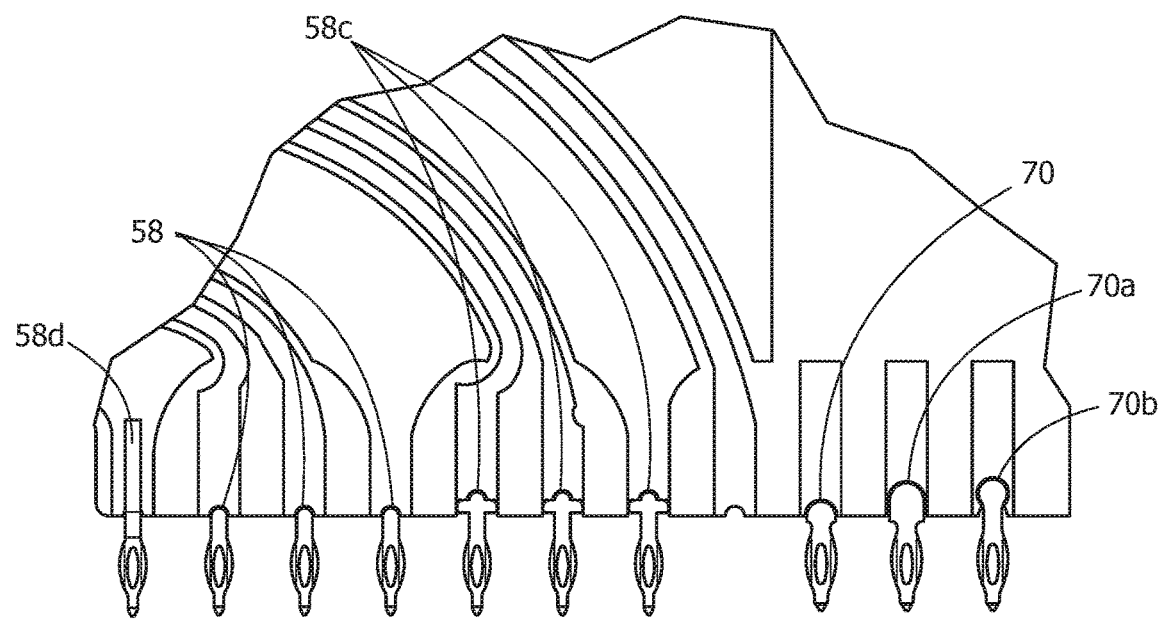
FIG. 6 is a front perspective view of an alternate printed circuit board wafer with alternate contacts mounted to alternate openings on the castellated edges of the printed circuit board.
Figure 7:
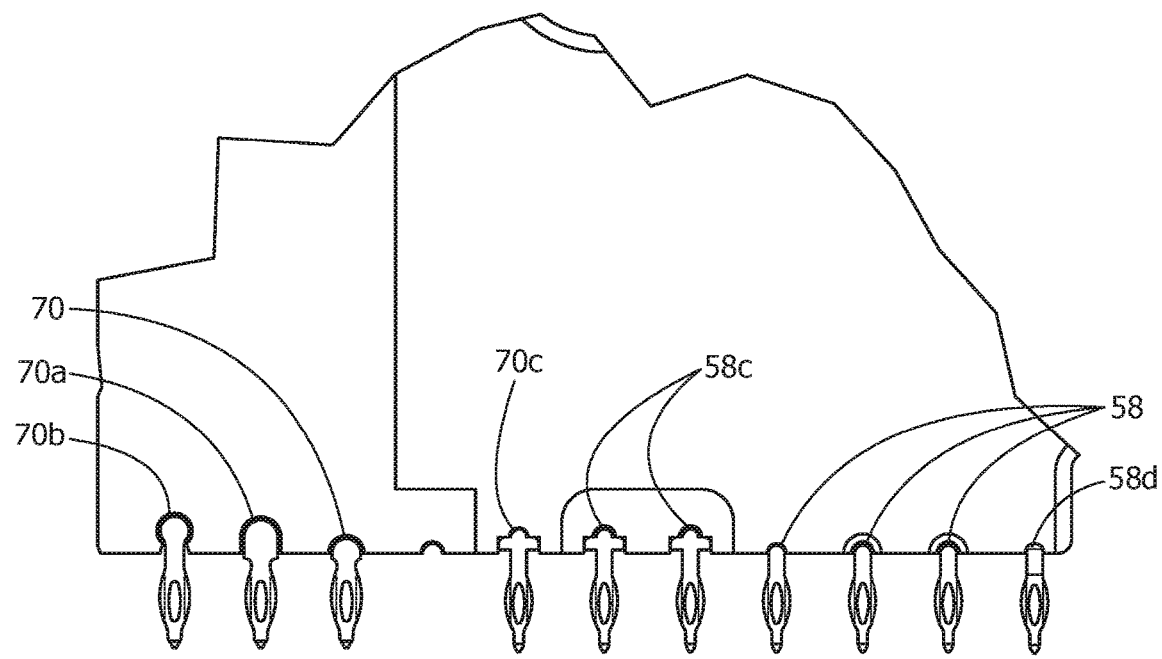
FIG. 7 is a back perspective view of the printed circuit board wafer of FIG. 6.

Different configuration of the signal contacts 58 and the ground contacts 70 may be used. FIGS. 6 and 7 show various illustrative alternate embodiments of the contacts. Configurations of the contacts include, but are not limited to, half round hole contact 58, 70, slotted hole contact 70*a*, double drilled hole contact 70*b*, notched hole contact 58*c*,70*c* and surface mount contact 58*d*. Each of the configuration of contact shown may be used for the signal contacts or the ground contacts. All of the contacts have a type of mounting surface which cooperates with the plated opening as described above.

While the invention has been described with reference to a preferred embodiment, it will be understood by those skilled in the art that various changes may be made and equivalents may be substituted for elements thereof without departing from the spirit and scope of the invention as defined in the accompanying claims. One skilled in the art will appreciate that the invention may be used with many modifications of structure, arrangement, proportions, sizes, materials and components and otherwise used in the practice of the invention, which are particularly adapted to specific environments and operative requirements without departing from the principles of the present invention. The presently disclosed embodiments are therefore to be considered in all respects as illustrative and not restrictive, the scope of the invention being defined by the appended claims, and not limited to the foregoing description or embodiments.

The invention claimed is:

1. A substrate assembly for mounting to a second substrate, the substrate assembly comprising:

a first substrate having a first surface and an oppositely facing second surface;

signal pathways provided on the first surface, the signal pathways extending to first openings extending inward from an edge of the substrate, the first openings having first walls;

first ground pathways provided on the first surface, each of the first ground pathways positioned adjacent to at least one of the signal pathways, the first ground pathways extending to second openings extending inward from the edge of the substrate, the second openings having second walls;

signal contacts mounted to the first substrate, the signal contacts having first mounting surfaces, the first mounting surfaces provide mechanical and electrical engagement with the first walls of the first openings;

ground contacts mounted to the first substrate, the ground contacts having second mounting surfaces, the second mounting surfaces provide mechanical and electrical engagement with the second walls of the second openings;

wherein mating force applied to the signal contacts and the ground contacts are transferred to the substrate.

2. The substrate assembly as recited in claim 1, wherein the signal pathways include mating signal contact pads proximate a mating end of the substrate which is spaced from the edge of the substrate.

3. The substrate assembly as recited in claim 2, wherein the first ground pathways include mating ground contact pads proximate the mating end of the substrate.

4. The substrate assembly as recited in claim 1, wherein the first openings have conductive plating provided on walls of the first openings.

5. The substrate assembly as recited in claim 1, wherein the second openings have conductive plating provided on walls of the second openings.

6. The substrate assembly as recited in claim 1, wherein one or more second ground pathways are provided on the second surface, the one or more second ground pathways extending to the edge of the first substrate.

7. The substrate assembly as recited in claim 1, wherein the first ground pathways and the second ground pathways surround pairs of signal pathways, wherein as the first ground pathways and the second ground pathways are electrically commoned together, the first ground pathways and the second ground pathways provide electrical shielding and reduce crosstalk between the pairs of signal pathways.

8. The substrate assembly as recited in claim 1, wherein the signal contacts have first substrate mounting portions, first compliant portions and first lead-in portions, the first mounting surfaces are provided on the first substrate mounting portions.

9. The substrate assembly as recited in claim 8, wherein the ground contacts have second substrate mounting portions, second compliant portions and second lead-in portions, the second mounting surfaces are provided on the second substrate mounting portions.

10. The substrate assembly as recited in claim 9, wherein the first compliant portions and the second compliant portions have eye of the needle configurations.

11. The substrate assembly as recited in claim 9, wherein the first openings, the second openings, the first mounting surfaces and the second mounting surfaces have arcuate configurations.

12. A printed circuit board assembly for mounting to a second printed circuit board, the printed circuit board assembly comprising:

a first printed circuit board having a first surface and an oppositely facing second surface, the first printed circuit board having a castellated edge;

signal pathways provided on the first surface, the signal pathways extending to first openings extending inward from a castellated edge of the first printed circuit board, the first openings having first walls;

first ground pathways provided on the first surface, each of the first ground pathways positioned adjacent at least one of the signal pathways, the first ground pathways extending to second openings extending inward from the castellated edge of the first printed circuit board, the second openings having second walls;

one or more second ground pathways provided on the second surface, the one or more second ground pathways extending to the castellated edge of the first printed circuit board;

signal contacts mounted to the first openings;

ground contacts mounted to the second openings;

wherein as the ends of the signal pathways, the first ground pathways and the second ground pathways are positioned in line or abut the castellated edge of the printed circuit boards the area of ground that is present on the printed circuit boards is maximized, which minimizes crosstalk between signal pairs of the signal pathways.

13. The printed circuit board assembly as recited in claim 12, wherein the first ground pathways and the second ground pathways surround pairs of signal pathways, wherein as the first ground pathways and the second ground pathways are electrically commoned together, the first ground pathways and the second ground pathways provide electrical shielding and reduce crosstalk between the pairs of signal pathways.

14. The printed circuit board assembly as recited in claim 13, wherein the signal contacts are mounted to the first printed circuit board, the signal contacts having first mounting surfaces, the first mounting surfaces provide in mechanical and electrical engagement with the first walls of the first openings.

15. The printed circuit board assembly as recited in claim 14, wherein the ground contacts are mounted to the first printed circuit board, the ground contacts having second mounting surfaces, the second mounting surfaces provide in mechanical and electrical engagement with the second walls of the second openings.

16. The printed circuit board assembly as recited in claim 15, wherein the first openings and the second openings have conductive plating provided on walls thereof.

17. The printed circuit board assembly as recited in claim 16, wherein the first openings, the second openings, the first mounting surfaces and the second mounting surfaces have arcuate configurations.

18. The printed circuit board assembly as recited in claim 17, wherein the signal contacts have first printed circuit board mounting portions, first compliant portions and first lead-in portions, the first mounting surfaces are provided on the first printed circuit board mounting portions.

19. The printed circuit board assembly as recited in claim 18, wherein the ground contacts have second printed circuit board mounting portions, second compliant portions and second lead-in portions, the second mounting surfaces are provided on the second printed circuit board mounting portions.

20. The printed circuit board assembly as recited in claim 19, wherein the first compliant portions and the second compliant portions have eye of the needle configurations.

* * * * *